(12) United States Patent
Wala

(10) Patent No.: US 7,639,982 B2
(45) Date of Patent: *Dec. 29, 2009

(54) POINT-TO-MULTIPOINT DIGITAL RADIO FREQUENCY TRANSPORT

(75) Inventor: Philip M. Wala, Waseca, MN (US)

(73) Assignee: ADC Telecommunications, Inc., Eden Prairie, MN (US)

( * ) Notice: Subject to any disclaimer, the term of this patent is extended or adjusted under 35 U.S.C. 154(b) by 509 days.

This patent is subject to a terminal disclaimer.

(21) Appl. No.: 10/740,944

(22) Filed: Dec. 19, 2003

(65) Prior Publication Data

US 2004/0132474 A1  Jul. 8, 2004

Related U.S. Application Data

(63) Continuation of application No. 09/619,431, filed on Jul. 19, 2000, now Pat. No. 6,704,545.

(51) Int. Cl.
*H04B 7/14* (2006.01)
*H04B 10/00* (2006.01)

(52) U.S. Cl. .............................. 455/16; 455/20; 455/7; 455/561; 455/3.05; 370/906; 370/907; 398/173

(58) Field of Classification Search .............. 455/7, 455/14–22, 553, 561, 3.01, 3.05; 370/906, 370/907, 498, 501, 535–537
See application file for complete search history.

(56) References Cited

U.S. PATENT DOCUMENTS 4,183,054 A  1/1980  Patisaul et al.
4,611,323 A  9/1986  Hessenmüller
4,628,501 A  12/1986  Loscoe
4,654,843 A  3/1987  Roza et al.
4,667,319 A * 5/1987  Chum .................. 370/260
4,691,292 A  9/1987  Rothweiler
4,760,573 A  7/1988  Calvignac et al.
4,999,831 A  3/1991  Grace
5,193,109 A  3/1993  Chien-Yeh Lee
5,243,598 A  9/1993  Lee
5,321,736 A * 6/1994  Beasley .................. 455/11.1

(Continued)

FOREIGN PATENT DOCUMENTS

| DE | 3707244 A | 9/1988 |
| EP | 0391597 | 10/1990 |
| EP | 0 664 821 | 7/1994 |
| WO | 9115927 | 10/1991 |
| WO | WO 91/15927 | * 10/1991 |

OTHER PUBLICATIONS

Akos et al., Direct Bandpass Sampling of Multiple Distinct RF Signals, Jul. 1999, pp. 983-988, vol. 47, Publisher: IEEE Transactions on Communications.

(Continued)

*Primary Examiner*—Duc M Nguyen
(74) *Attorney, Agent, or Firm*—Frogg & Powers LLC

(57) ABSTRACT

A digital radio frequency transport system that performs bi-directional simultaneous digital radio frequency distribution is provided. The transport system includes a digital host unit and at least two digital remote units coupled to the digital host unit. The bi-directional simultaneous digital radio frequency distribution is performed between the digital host unit and the at least two digital remote units.

81 Claims, 8 Drawing Sheets

U.S. PATENT DOCUMENTS

| | | | |
|---|---|---|---|
| 5,321,849 A | 6/1994 | Lemson | |
| 5,339,184 A | 8/1994 | Tang | |
| 5,499,047 A * | 3/1996 | Terry et al. | 725/127 |
| 5,603,080 A | 2/1997 | Kallander et al. | |
| 5,621,786 A | 4/1997 | Fischer et al. | |
| 5,627,879 A | 5/1997 | Russell et al. | |
| 5,642,405 A | 6/1997 | Fischer et al. | |
| 5,644,622 A | 7/1997 | Russell et al. | |
| 5,657,374 A | 8/1997 | Russell et al. | |
| 5,708,961 A * | 1/1998 | Hylton et al. | 725/81 |
| 5,724,385 A | 3/1998 | Levin et al. | |
| 5,765,097 A * | 6/1998 | Dail | 725/125 |
| 5,765,099 A | 6/1998 | Georges et al. | |
| 5,774,789 A | 6/1998 | van der Kaay et al. | |
| 5,802,173 A * | 9/1998 | Hamilton-Piercy et al. | 379/56.2 |
| 5,809,431 A * | 9/1998 | Bustamante et al. | 455/562.1 |
| 5,852,651 A | 12/1998 | Fischer et al. | |
| 5,878,325 A * | 3/1999 | Dail | 725/125 |
| 5,946,622 A | 8/1999 | Bojeryd | |
| 5,969,837 A | 10/1999 | Farber et al. | |
| 5,978,650 A * | 11/1999 | Fischer et al. | 725/73 |
| 6,005,884 A * | 12/1999 | Cook et al. | 375/132 |
| 6,112,086 A * | 8/2000 | Wala | 455/434 |
| 6,147,786 A | 11/2000 | Pan | |
| 6,181,687 B1 * | 1/2001 | Bisdikian | 370/347 |
| 6,192,216 B1 * | 2/2001 | Sabat et al. | 455/507 |
| 6,198,558 B1 | 3/2001 | Graves et al. | |
| 6,262,981 B1 * | 7/2001 | Schmutz | 370/347 |
| 6,275,990 B1 * | 8/2001 | Dapper et al. | 725/106 |
| 6,317,884 B1 * | 11/2001 | Eames et al. | 709/217 |
| 6,337,754 B1 * | 1/2002 | Imajo | 398/115 |
| 6,362,908 B1 | 3/2002 | Kimbrough et al. | |
| 6,374,124 B1 * | 4/2002 | Slabinski | 455/562.1 |
| 6,466,572 B1 * | 10/2002 | Ethridge et al. | 370/352 |
| 6,480,551 B1 * | 11/2002 | Ohishi et al. | 375/260 |
| 6,486,907 B1 | 11/2002 | Farber et al. | |
| 6,697,603 B1 * | 2/2004 | Lovinggood et al. | 455/13.1 |
| 6,771,933 B1 * | 8/2004 | Eng et al. | 455/41.2 |
| 6,785,558 B1 * | 8/2004 | Stratford et al. | 455/561 |
| 6,801,767 B1 * | 10/2004 | Schwartz et al. | 455/426.2 |
| 7,035,671 B2 * | 4/2006 | Solum | 455/562.1 |
| 2003/0143947 A1 * | 7/2003 | Lyu | 455/7 |

OTHER PUBLICATIONS

FOXCOM Wireless Properietary Information, Litenna In-Building RF Distribution System, pp. 1-8, 1998.

FOXCOM Wireless Proprietary Information, Application Note Rfiber-RF Fiberoptic Links for Wireless Applications. pp. 3-11, 1998.

Nakatsugawa et al., Software Radio Base and Personal Stations for Cellular/PCS Systems, pp. 617-621, Publisher: IEEE, 2000.

Gallagher, U.S. Appl. No. 09/273,197, "Digital Return Path for Hybrid/Fiber Coax Network", filed on Mar. 19, 1999 (copy enclosed).

Donohue et al., U.S. Appl. No. 09/432.558, "Digital Node for Hybrid/Fiber Coax Network", filed on Nov. 3, 1999 (copy enclosed).

Donohue, U.S. Appl. No. 09/433,332, "Digital Return Path for Hybrid/Fiber Coax Network", filed on Nov. 3, 1999 (copy enclosed).

Wala, "A New Microcell Architecture Using Digital Optical Transport ", "Freedom Through Wireless Technogolgy", May 18, 1993, pp. 585-588, Publisher: Proceedings of the Vehicular Technology Conference, New York, IEEE, Published in: US.

Grace, Martin K., "Synchronous Quantized Subcarrier Multiplexing for Transport of Video, Voice and Data", "IEEE Journal on Selected Areas in Communications", Sep. 1990, pp. 1351-1358, vol. 8, No. 7, Publisher: IEEE.

Harvey et al., "Cordless Communications Utilising Radio Over Fibre Techniques for the Local Loop", "IEEE International Conference on Communications", , pp. 1171-1175, Publisher: IEEE.

* cited by examiner

POINT-TO-MULTIPOINT DIGITAL RADIO FREQUENCY TRANSPORT

CROSS REFERENCE TO RELATED APPLICATIONS

This application is a continuation of U.S. application Ser. No. 09/619,431, filed Jul. 19, 2000, entitled "POINT-TO-MULTIPOINT DIGITAL RADIO FREQUENCY TRANSPORT", which is incorporated herein by reference.

TECHNICAL FIELD

The present invention is related to high capacity mobile communications systems, and more particularly to a point-to-multipoint digital micro-cellular communication system.

BACKGROUND INFORMATION

With the widespread use of wireless technologies additional signal coverage is needed in urban as well as suburban areas. One obstacle to providing full coverage in these areas is steel frame buildings. Inside these tall shiny buildings (TSBs), signals transmitted from wireless base stations attenuate dramatically and thus significantly impact the ability to communicate with wireless telephones located in the buildings. In some buildings, very low power ceiling mounted transmitters are mounted in hallways and conference rooms within the building to distribute signals throughout the building. Signals are typically fed from a single point and then split in order to feed the signals to different points in the building.

In order to provide coverage a single radio frequency (RF) source needs to simultaneously feeds multiple antenna units, each providing coverage to a different part of a building for example. Simultaneous bi-directional RF distribution often involves splitting signals in the forward path (toward the antennas) and combining signals in the reverse path (from the antennas). Currently this can be performed directly at RF frequencies using passive splitters and combiners to feed a coaxial cable distribution network. In passive RF distribution systems, signal splitting in the forward path is significantly limited due to inherent insertion loss associated with the passive devices. Each split reduces the level of the signal distributed in the building thereby making reception, e.g. by cell phones, more difficult. In addition, the high insertion loss of coaxial cable at RF frequencies severely limits the maximum distance over which RF signals can be distributed. Further, the system lacks any means to compensate for variations of insertion loss in each path.

Another solution to distributing RF signals in TSBs is taking the RF signal from a booster or base station, down converting it to a lower frequency, and distributing it via Cat 5 (LAN) or coaxial cable wiring to remote antenna units. At the remote antenna units, the signal is up converted and transmitted. While down-conversion reduces insertion loss, the signals are still susceptible to noise and limited dynamic range. Also, each path in the distribution network requires individual gain adjustment to compensate for the insertion loss in that path.

In another approach, fiber optic cables are used to distribute signals to antennas inside of a building. In this approach, RF signals are received from a bi-directional amplifier or base station. The RF signals directly modulate an optical signal, which is transported throughout the building as analog modulated light signals over fiber optic cable. Unfortunately, conventional systems using analog optical modulation transmission over optical fibers require highly sophisticated linear lasers to achieve adequate performance. Also, analog optical systems are limited in the distance signals can be transmitted in the building. Typically, this limitation is made worse due to the use of multimode fiber that is conventionally available in buildings. Multimode fiber is wider than single mode fiber and supports a number of different reflection modes so that signals tend to exhibit dispersion at the terminating end of the fiber. In addition, analog installation typically includes significant balancing when setting up the system. Further, RF levels in the system need to be balanced with the optical levels. If there is optical attenuation, the RF levels need to be readjusted. In addition, if the connectors are not well cleaned or properly secured, the RF levels can change.

Digitization of the RF spectrum prior to transport solves many of these problems. The level and dynamic range of digitally transported RF remains unaffected over a wide range of path loss. This allows for much greater distances to be covered, and eliminates the path loss compensation problem. However, this has been strictly a point-to-point architecture. One drawback with digitally transported RF in a point-to-point architecture is the equipment and cost requirement. A host RF to digital interface device is needed for each remote antenna unit. In particular, for use within a building or building complex the number of RF to digital interface devices and the fiber to connect these devices is burdensome. For example, in a building having 20 floors, the requirement may include 20 host RF to digital interface devices for 20 remote antenna units, 1 per floor. In some applications more than one remote antenna unit per floor may be required. As a result, there is a need in the art for improved techniques for distributing RF signals in TSBs, which would incorporate the benefits of digital RF transport into a point-to-multipoint architecture.

SUMMARY OF THE INVENTION

The above-mentioned problems with distributing RF signals within a building and other problems are addressed by the present invention and will be understood by reading and studying the following specification.

In one embodiment, a digital radio frequency transport system is provided. The transport system includes a digital host unit and at least two digital remote units coupled to the digital host unit. The digital host unit includes shared circuitry that performs bi-directional simultaneous digital radio frequency distribution between the digital host unit and the at least two digital remote units.

In another embodiment, a digital radio frequency transport system is provided. The transport system includes a digital host unit and at least one digital expansion unit coupled to the digital host unit. The transport system further includes at least two digital remote units, each coupled to one of the digital host unit and the digital expansion unit. The digital host unit includes shared circuitry that performs bi-directional simultaneous digital radio frequency distribution between the digital host unit and the at least two digital remote units.

In an alternate embodiment, a method of performing point-to-multipoint radio frequency transport is provided. The method includes receiving radio frequency signals at a digital host unit and converting the radio frequency signals to a digitized radio frequency spectrum. The method also includes optically transmitting the digitized radio frequency spectrum to a plurality of digital remote units. The method further includes receiving the digitized radio frequency spectrum at the plurality of digital remote units, converting the digitized radio frequency spectrum to analog radio frequency signals and transmitting the analog radio frequency signals via a main radio frequency antenna at each of the plurality of digital remote units.

DETAILED DESCRIPTION

In the following detailed description of the preferred embodiments, reference is made to the accompanying drawings that form a part hereof, and in which is shown by way of illustration specific embodiments in which the invention may be practiced. It is to be understood that other embodiments may be utilized and structural changes may be made without departing from the scope of the present invention.

Figure 1:
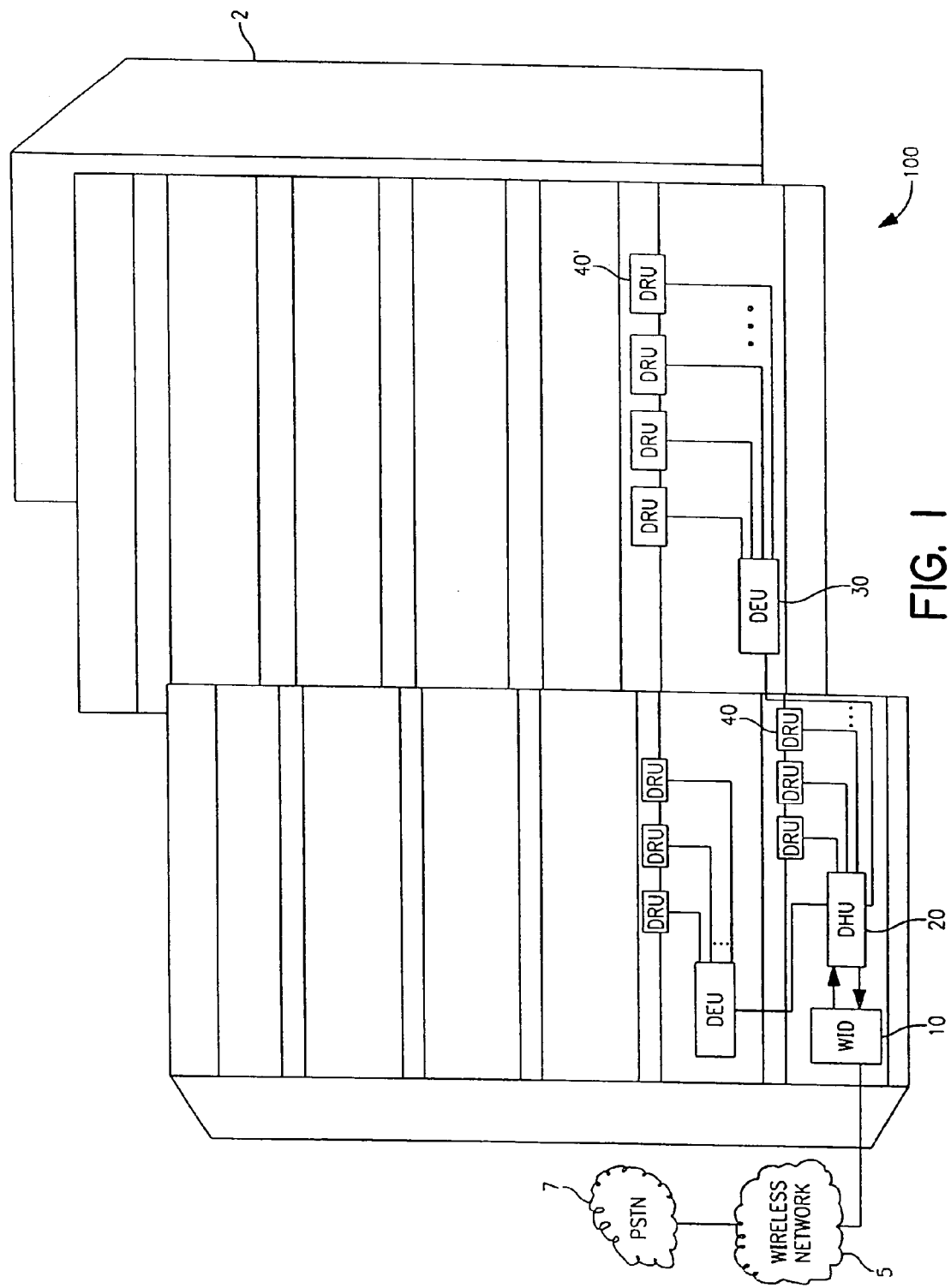
FIG. 1 is an illustration of one embodiment of a point-to-multipoint communication system according to the teachings of the present invention.

FIG. 1 is an illustration of one exemplary embodiment of a point-to-multipoint digital transport system shown generally at 100 and constructed according to the teachings of the present invention. The point-to-multipoint digital transport system 100 is shown distributed within a complex of tall shiny buildings (TSBs) 2. Although system 100 is shown in a complex of TSBs 2, it is understood that system 100 is not limited to this embodiment. Rather, system 100 in other embodiments is used to distribute signals in a single building, or other appropriate structure or indoor or outdoor location that exhibits high attenuation to RF signals. Advantageously, system 100 uses digital summing of digitized RF signals from multiple antennas to improve signal coverage in structures, such as TSBs.

Point-to-multipoint digital transport of RF signals is accomplished through a network of remote antenna units or digital remote units 40 and 40' and a digital host unit 20, which interfaces with a wireless network 5 which is coupled to the public switched telephone network (PSTN), or a mobile telecommunications switching office (MTSO) or other switching office/network. System 100 operates by transporting RF signals digitally over fiber optic cables. Signals received at DHU 20 are distributed to multiple DRUs 40 and 40' to provide coverage throughout a building complex. In addition, signals received at each of the DRUs 40 and 40' are summed together at the DHU 20 for interface to a wireless network.

In one embodiment, digital expansion unit DEU 30 is situated between the DHU 20 and one or more DRUs. In the forward path, DEU 30 expands the coverage area by splitting signals received from DHU 20 to a plurality of DRUs 40'. In the reverse path, DEU 30 receives signals from a plurality of DRUs 40', digitally sums the signals together and transports them to a DHU 20 or another DEU such as 30. This system allows for successive branching of signals using DEUs 30 and expanded coverage to multiple DRUs 40 and 40'. This system provides an efficient way of providing signal coverage for wireless communication without added attenuation loss and distance constraint found with analog systems. By using DEUs 30, antennas can be placed further from DHU 20 without adversely affecting signal strength since shorter fiber optic cables can be used.

Digital transport system 100 includes a wireless interface device (WID) 10 that provides an interface to a wireless network. In one embodiment, the WID 10 includes either conventional transmitters and receivers or all digital transmitter and receiver equipment, and interface circuitry to a mobile telecommunications switching office (MTSO). In one embodiment, the wireless interface device 10 is coupled to an MTSO via a T1 line and receives and transmits signals between the MTSO and the DHU 20. In another embodiment, the wireless interface device 10 is coupled to the public switched telephone network (PSTN). In one embodiment, WID 10 comprises a base station and connects directly to DHU 20 via coaxial cables. In another embodiment, WID 10 comprises a base station and wirelessly connects to DHU 20 via a bi-directional amplifier that is connected to an antenna. In one embodiment, the antenna is an outdoor antenna.

WID 10 communicates signals between wireless units and the wireless network via digital remote units DRUs 40 and 40'. WID 10 is coupled to DHU 20. The DHU 20 is coupled to at least one digital expansion unit DEU 30 and a plurality of DRUs 40. In addition, DEU 30 is coupled to a plurality of DRUs 40'. The DHU 20 receives RF signals from WID 10 and converts the RF signals to digital RF signals. DHU 20 further optically transmits the digital RF signals to multiple DRUs 40 either directly or via one or more DEUs 30.

Each DRU 40 and 40' is connected through a fiber optic cable (or optionally another high bandwidth carrier) to transport digital RF signals to one of DHU 20 or DEU 30. In one embodiment, the fiber optic cable comprises multimode fiber pairs coupled between the DRUs 40 and the DHU 20, between the DRUs 40 and 40' and the DEUs 30 and between the DEUs 30 and the DHU 20. In one embodiment, the DEU 30 is coupled to the DHU 20 via single mode fiber and the DEU 30 is coupled to the DRUs 40' via multimode fiber pairs. Although, transport system 100 has been described with fiber optic cable other carriers may be used, e.g., coaxial cable.

In another embodiment, the DHU 20 is coupled to the DRUs 40 by a direct current power cable in order to provide power to each DRU 40. In one embodiment, the direct current power cable delivers 48 VDC to each DRU 40 connected to the DHU 20. In another embodiment, the DEU 30 is coupled to DRUs 40' by a direct current power cable to provide power to each DRU 40'. In one embodiment, the direct current power cable delivers 48 VDC to each DRU 40' connected to the DEU 30. In an alternate embodiment, DRUs 40 and 40' are connected directly to a power supply. In one embodiment, the power supply provides DC power to the DRUs 40 and 40'. In an alternate embodiment, the power supply provides AC power to the DRUs 40 and 40'. In one embodiment, DRUs 40 and 40' each include an AC/DC power converter.

Both DHU 20 and DEU 30 split signals in the forward path and sum signals in the reverse path. In order to accurately sum the digital signals together at DHU 20 or DEU 30 the data needs to come in to the DHU 20 or DEU 30 at exactly the same rate. As a result all of the DRUs 40 and 40' need to be synchronized so that their digital sample rates are all locked together. Synchronizing the signals in time is accomplished by locking everything to the bit rate over the fiber. In one embodiment, the DHU 20 sends out a digital bit stream and the optical receiver at the DEU 30 or DRU 40 detects that bit stream and locks its clock to that bit stream. In one embodiment, this is being accomplished with a multiplexer chip set and local oscillators, as will be described below. Splitting and combining the signals in a digital state avoids the combining and splitting losses experienced with an analog system. In addition, transporting the digital signals over multimode fiber results in a low cost transport system that is not subject to much degradation.

The down-conversion and up-conversion of RF signals are implemented by mixing the signal with a local oscillator (LO) at both the DRUs and the DHU. In order for the original frequency of the RF signal to be restored, the signal must be up-converted with an LO that has exactly the same frequency as the LO that was used for down conversion. Any difference in LO frequencies will translate to an equivalent end-to-end frequency offset. In the embodiments described, the down conversion and up conversion LOs are at locations remote from one another. Therefore, in one preferred embodiment, frequency coherence between the local and remote LO's is established as follows: at the DHU end, there is a 142 MHz reference oscillator which establishes the bit rate of 1.42 GHz over the fiber. This reference oscillator also generates a 17.75 MHz reference clock which serves as a reference to which LO's at the DHU are locked.

At each of the DRUs, there is another 17.75 MHz clock, which is recovered from the optical bit stream with the help of the clock and bit recovery circuits. Because this clock is recovered from the bit stream generated at the host, it is frequency coherent with the reference oscillator at the host. A reference 17.75 MHz clock is then generated to serve as a reference for the remote local oscillators. Because the remote recovered bit clock is frequency coherent with the host master clock, the host and remote reference clocks, and any LO's locked to them, are also frequency coherent, thus ensuring that DHU and DRU LO's are locked in frequency. It is understood that in other embodiments the bit rate over the fiber may vary and the frequency of the clocks will also vary.

Figure 2:
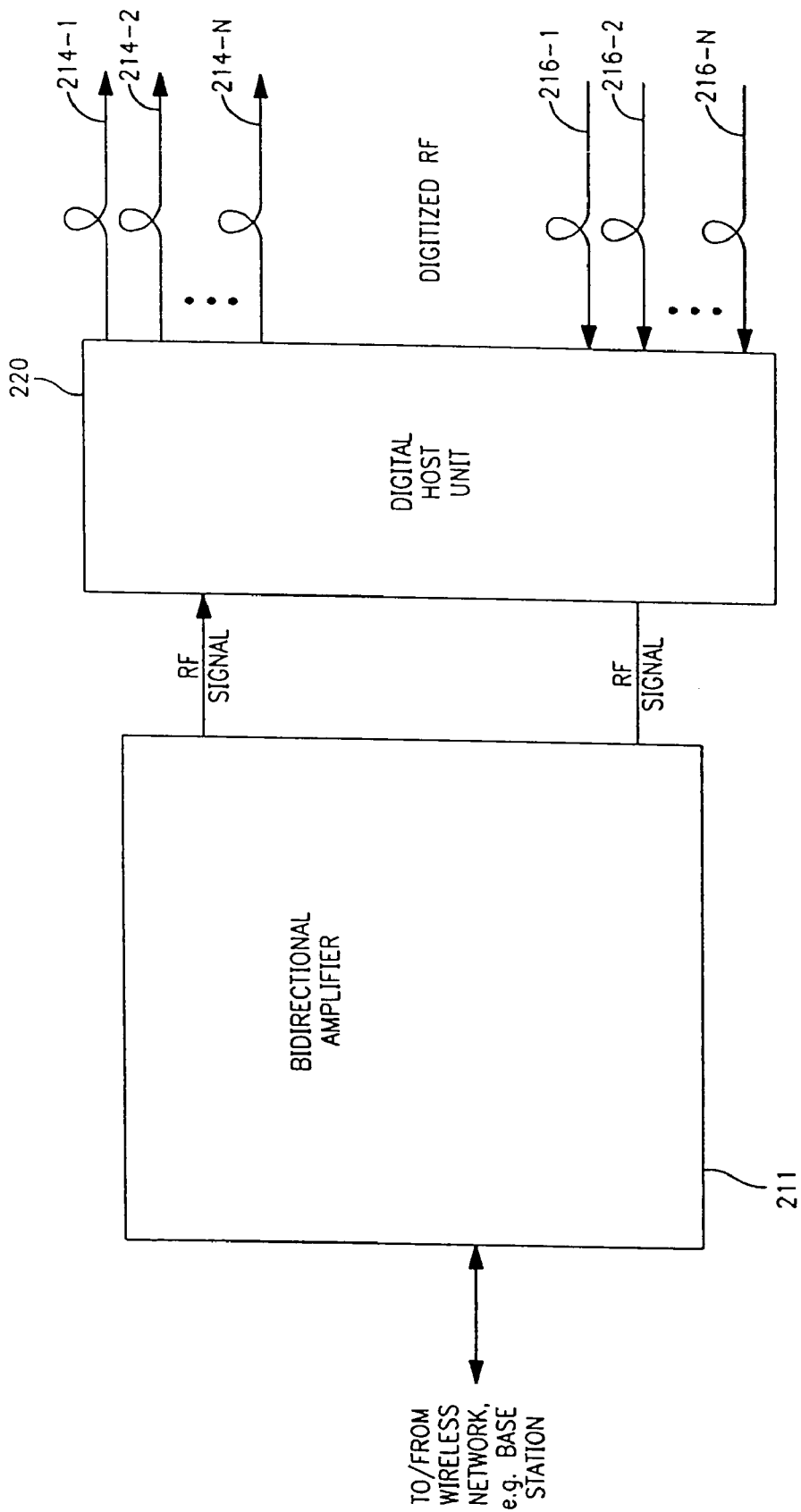
FIG. 2 is a block diagram of one embodiment of a communication system according to the teachings of the present invention.

FIG. 2 is a block diagram of one embodiment of a communication system, shown generally at 200 and constructed according to the teachings of the present invention. In this embodiment, a digital host unit (DHU) 220 is coupled to a bi-directional amplifier (BDA) 211. The BDA 211 receives communication signals from a wireless interface device (WID) and transports the communication signals as RF signals to the DHU 220 and receives RF signals from DHU 220 and transmits the RF signals to the WID. The DHU 220 receives RF signals from the BDA 211 and digitizes the RF signals and optically transmits the digital RF signals to multiple DRUs via transmission lines 214-1 to 214-N. DHU 220 also receives digitized RF signals over transmission lines 216-1 to 216-N from a plurality of DRUs either directly or indirectly via DEUs, reconstructs the corresponding analog RF signals, and applies them to BDA 211. In one embodiment, DHU 220 receives signals directly from a plurality N of DRUs. The signals are digitally summed and then converted to analog signals and transmitted to BDA 211. In another embodiment, DHU 220 receives signals from one or more DEUs and one or more DRUs directly. Again, the signals are all digitally summed and then converted to analog signals and transmitted to BDA 211. The signals received via transmission lines 216-1 to 216-N may be received directly from a DRU or signals that are received by a DEU and summed together and then transported via 216-1 to 216-N to DHU 220 for additional summing and conversion for transport to BDA 211. DEUs provide a way to expand the coverage area and digitally sum signals received from DRUs or other DEUs for transmission in the reverse path to other DEUs or DHU 220. In one embodiment, transmission lines 214-1 to 214-N and 216-1 to 216-N comprise multimode fiber pairs. In an alternate embodiment, each fiber pair is replaced by a single fiber, carrying bi-directional optical signals through the use of wavelength division multiplexing (WDM). In an alternate embodiment, transmission lines 214-1 to 214-N and 216-1 to 216-N comprise single mode fibers. In one embodiment, N is equal to six. In an alternate embodiment, the number of transmission lines in the forward path direction 214-1 to 214-N is not equal to the number of transmission lines in the reverse path direction 216-1 to 216-N.

Figure 3:
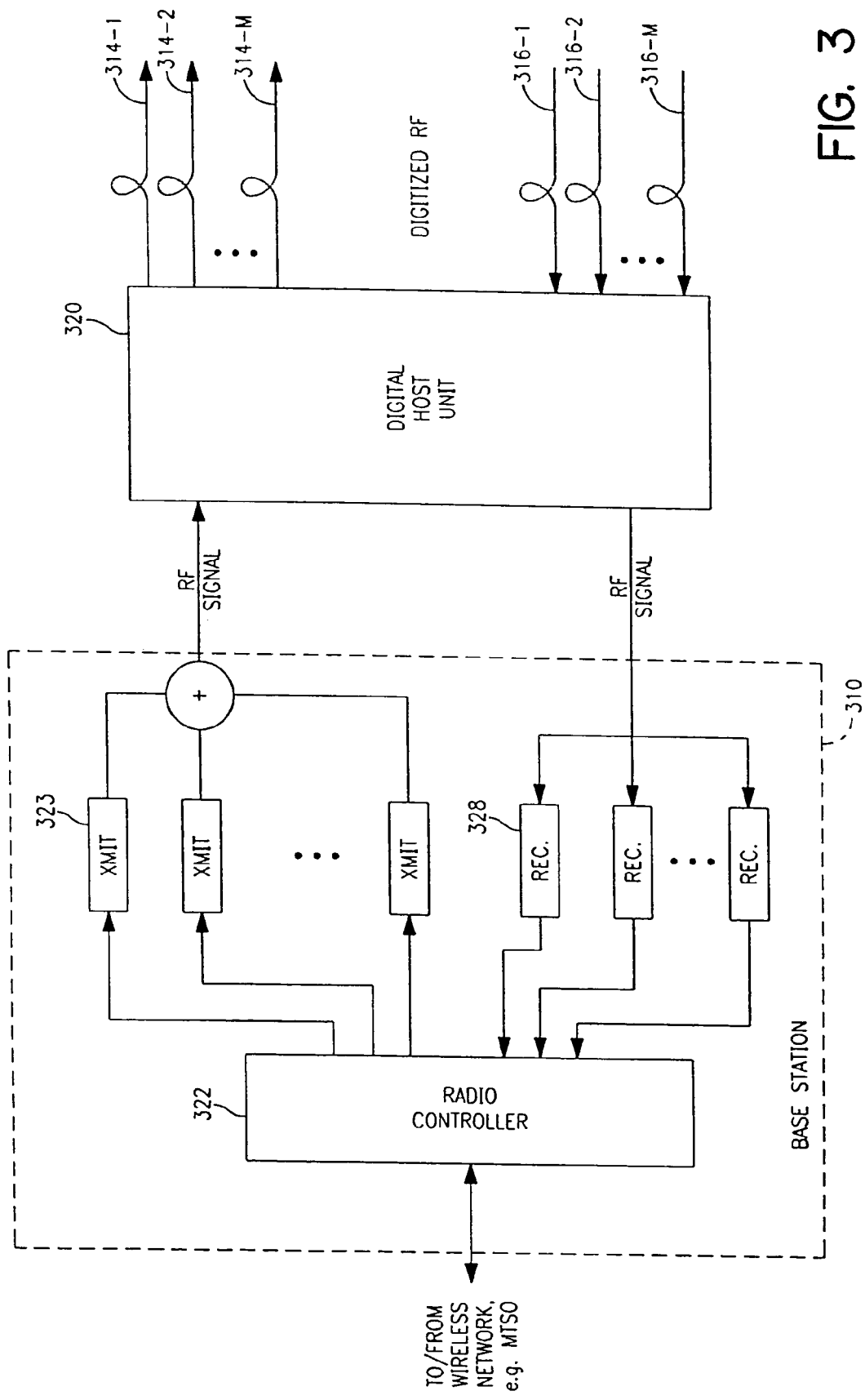
FIG. 3 is a block diagram of another embodiment of a communication system according to the teachings of the present invention.

FIG. 3 is a block diagram of an alternate embodiment of a communication system shown generally at 300 and constructed according to the teachings of the present invention. Communication system 300 includes a base station 310 coupled to a DHU 320. Base station 310 includes conventional transmitters and receivers 323 and 328, respectively, and conventional radio controller or interface circuitry 322 to an MTSO or telephone switched network. DHU 320 is coupled to base station 310. DHU 320 is also coupled to transmission lines 314-1 to 314-M, which transmit in the forward path direction and transmission lines 316-1 to 316-M, which transmit in the reverse path direction.

DHU 320 essentially converts the RF spectrum to digital in the forward path and from digital to analog in the reverse path. In the forward path, DHU 320 receives the combined RF signal from transmitters 323, digitizes the combined signal and transmits it in digital format over fibers 314-1 to 314-M, which are connected directly to a plurality of DRUs or indirectly to one or more DRUs via one or more DEUs.

In one embodiment, DHU 320 receives signals directly from a plurality M of DRUs. The signals are digitally summed and then converted to analog signals and transmitted to base station 310. In another embodiment, DHU 320 receives signals from one or more DEUs and one or more DRUs directly. Again, the signals are all digitally summed and then converted to analog signals and transmitted to base station 310. The signals received via transmission lines 316-1 to 316-M may be received directly from a DRU or signals that are received by a DEU and summed together and then transported via 316-1 to 316-M to DHU 320 for additional summing and conversion for transport to base station 210. DEUs provide a way to expand the coverage area by splitting signals in the forward path and digitally summing signals received from DRUs or other DEUs in the reverse path for transmission upstream to other DEUs or a DHU. In the reverse path, DHU 320 also receives digitized RF signals over fibers 316-1 to 316-M from a plurality of DRUs, either directly or indirectly via DEUs, reconstructs the corresponding analog RF signal, and applies it to receivers 328.

In one embodiment, transmission lines 314-1 to 314-M and 316-1 to 316-M comprise multimode fiber pairs. In an alternate embodiment, each fiber pair is replaced by a single fiber, carrying bi-directional optical signals through the use of wavelength division multiplexing (WDM). In an alternate embodiment, transmission lines 314-1 to 314-M and 316-1 to 316-M comprise single mode fibers. In one embodiment, M is equal to six. In an alternate embodiment, the number of transmission lines in the forward path direction 314-1 to 314-M is not equal to the number of transmission lines in the reverse path direction 316-1 to 316-M.

Figure 4:
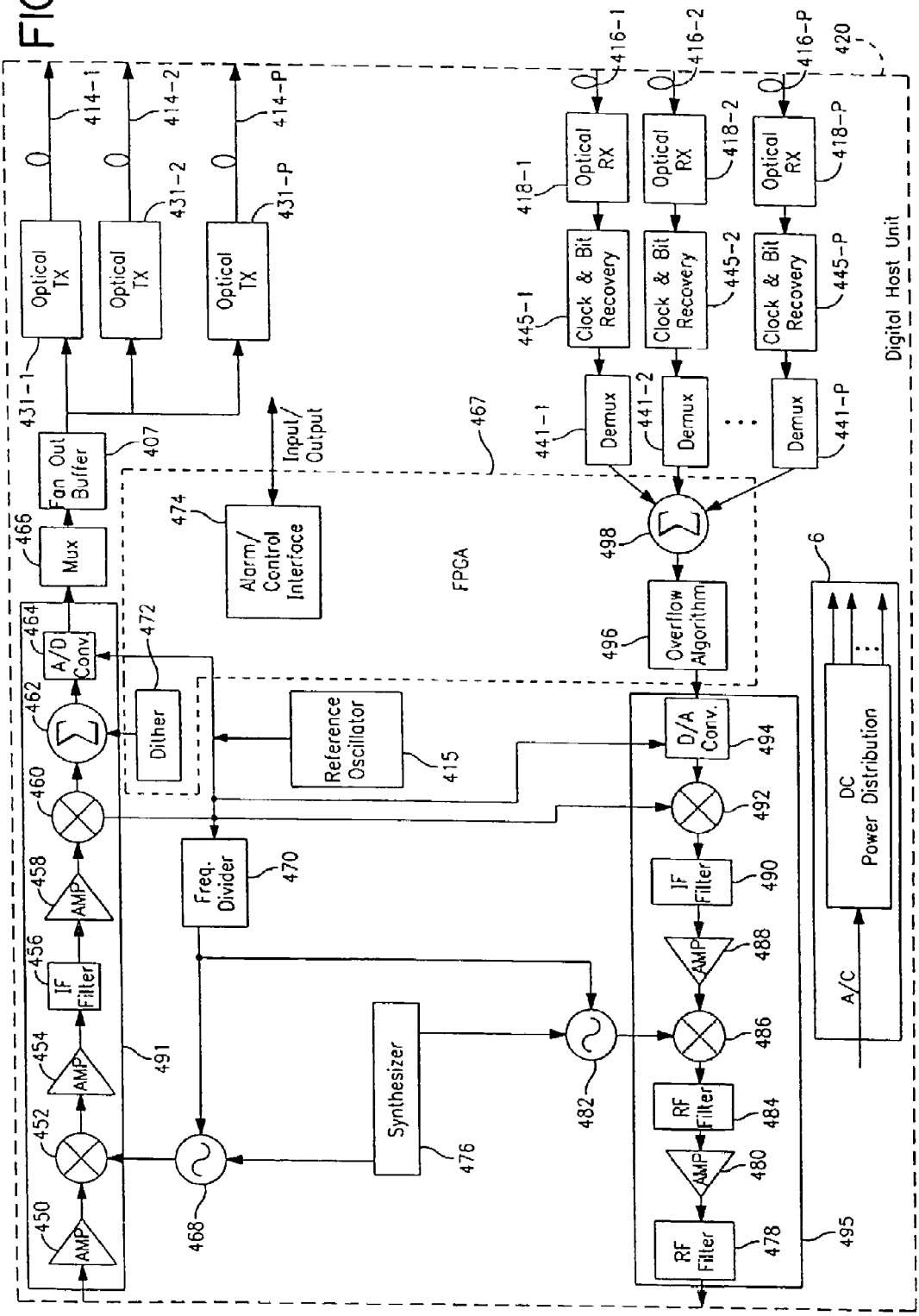
FIG. 4 is a block diagram of one embodiment of a digital host unit according to the teachings of the present invention.

Referring now to FIG. 4, there is shown one embodiment of a DHU 420 constructed according to the teachings of the present invention. DHU 420 includes an RF to digital converter 491 receiving the combined RF signals from a wireless interface device such as a base station, BDA or the like. RF to digital converter 491 provides a digitized traffic stream that is transmitted to multiplexer 466. Multiplexer 466 converts the parallel output of the A/D converter into a framed serial bit stream. At the output of the multiplexer is a 1 to P fan out buffer 407, which splits the digital signal P ways. There are P optical transmitters 431-1 to 431-P one feeding each of the P optical transmission lines 414-1 to 414-P. The digitized signals are applied to fibers 414-1 to 414-P for transmission to corresponding DRUs either directly or via DEUs. In one embodiment, P is equal to 6.

In one embodiment, DHU 420 includes an amplifier 450 that receives the combined RF signal from a wireless interface device such as a base station or BDA. The combined RF signal is amplified and then mixed by mixer 452 with a signal received from local oscillator 468. Local oscillator 468 is coupled to reference oscillator 415. In one embodiment the local oscillator is coupled to a frequency divider circuit 470, which is in turn coupled to reference oscillator 415. The local oscillator is locked to the reference oscillator 415 as a master clock so that the down conversion of the RF signals is the same as the up conversion. The result is end to end, from DHU to DRU, or DHU to one or more DEUs to DRU, no frequency shift in the signals received and transmitted. The local oscillator 463 is also coupled to a synthesizer circuit 476.

The output signal of mixer 452 is provided to amplifier 454 amplified and then filtered via intermediate frequency (IF) filter 456. The resultant signal is the combined RF signal converted down to an IF signal. The IF signal is mixed with another signal originating from the reference oscillator 415 via mixer 460. The output of mixer 460 is summed together at 462 with a signal produced by field programmable gate array (FPGA) 467. The output is then converted from an analog signal to a digital signal via analog/digital (A/D) converter 464 once converted the digital RF signal is applied to multiplexer 466. In one embodiment, the A/D converter 464 is a 14-bit converter handling a 14-bit signal. In other embodiments, the A/D converter 464 may be of any size to accommodate an appropriate signal. In one embodiment, the input signal from FPGA 467 is a dither signal from dither circuit 462 that adds limited out of band noise to improve the dynamic range of the RF signal.

In one embodiment, DHU 420 includes an alternating current to digital current power distribution circuit 6 that provides direct current power to each of the DRUs coupled to DHU 420.

DHU 420 further includes a plurality of digital optical receivers 418-1 to 418-P in the reverse path. Receivers 418-1 to 418-P each output an electronic digital signal, which is applied to clock and bit recovery circuits 445-1 to 445-P, respectively, for clock and bit recovery of the electronic signals. The signals are then applied to demultiplexers 441-1 to 441-P, respectively, which extract the digitized signals generated at the DRUs, as will be explained in detail below. Demultiplexers 441-1 to 441-P further extract alarm (monitoring) and voice information framed with the digitized signals. The digitized signals output at each demultiplexer 441-1 to 441-P are then applied to FPGA 467 where the signals are summed together and then applied to digital to RF converter 495. Converter 495 operates on the sum of the digitized signals extracted by demultiplexers 441-1 to 441-P, reconstructing baseband replicas of the RF signals received at all the digital remote units. The baseband replicas are then up-converted to their original radio frequency by mixing with a local oscillator 482 and filtering to remove image frequencies. Local oscillator 482 is coupled to synthesizer 476 and reference oscillator as discussed with respect to local oscillator 468 above.

In one embodiment, digital to RF converter 495 includes digital to analog (D/A) converter 484 coupled to an output of FPGA 467 the digitized RF signals are converted to analog RF signals and then mixed with a signal from reference oscillator 415 by mixer 492. The signal is then filtered by IF filter 490 and amplified by amplifier 488. The resultant signal is then mixed with a signal from local oscillator 482 and then applied to RF filter 484, amplifier 480 and RF filter 478 for transmission by a wireless interface device such as a BDA or base station.

In one embodiment, FPGA 467 includes an alarm/control circuit 474, which extracts overhead bits from DRUs to monitor error and alarm information. In one embodiment, the FPGA 467 includes a summer 498, which mathematically sums together the digital RF signals received from fibers 416-1 to 416-P. In another embodiment FPGA includes an overflow algorithm circuit 486 coupled to the output of summer 486. The algorithm circuit 496 allows the summed digital RF signals to saturate and keep the summed signal within a defined number of bits. In one embodiment, the algorithm circuit includes a limiter. In one embodiment, the RF signals are 14-bit signals and when summed and limited by summer 498 and overflow algorithm 496 result in a 14-bit output signal.

For example, in one embodiment each of the digital RF signals received from fibers 416-1 to 416-P, where P is equal to 6, comprise 14 bit inputs. All of those 6 different 14 bit inputs then go into summer 498. In order to allow for overflow, at least 17 bits of resolution is needed in the summer 498 to handle a worst-case scenario when all 6 of the 14 bit inputs are at full scale at the same time. In this embodiment, a 17-bit wide summer 498 is employed to handle that dynamic range. Coming out of summer 498 is needed a 14-bit signal going in the reverse path. In one embodiment, an algorithm circuit 496 for managing the overflow is implemented. In one embodiment, the summer and 498 and overflow algorithm 496 are included in FPGA 467. In one embodiment, overflow algorithm 496 acts like a limiter and allows the sum to saturate and keeps the summed signal within 14 bits. In an alternate embodiment, overflow algorithm circuit 496 controls the gain and scales the signal dynamically to handle overflow conditions.

Figure 8:
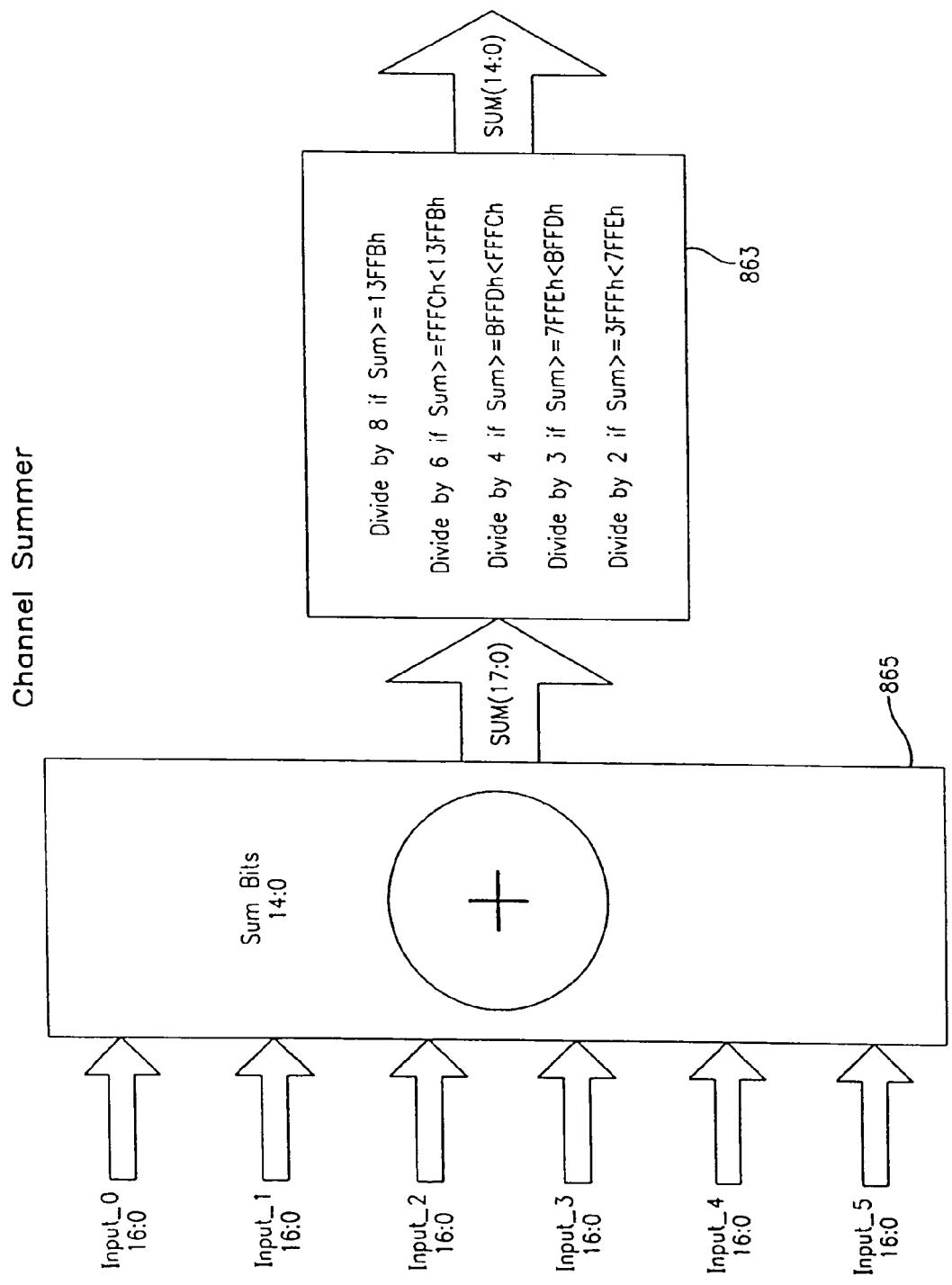
FIG. 8 is an illustration of one embodiment of an overflow algorithm for a channel summer according to the teachings of the present invention.

FIG. 8 illustrates one embodiment of an algorithm 863 for a channel summer 865 in order to limit the sum of input signals 0 to 5 to 14 bits. In this embodiment, input signals 0 to 5 comprise 6 signals that are summed together by summer 865. The sum of input signals 0 to 5 is reduced to a signal having 14 bits or less by the algorithm 863. It is understood that the algorithm 865 is by example and is not meant to restrict the type of algorithm used to limit the sum of signals 0 to 5 to 14 bits or less.

For example, when the sum of the 6 input signals 0 to 5 is greater than or equal to 13FFBh then the sum is divided by 6 for a signal that is 14 bits or less. When the sum of the 6 input signals 0 to 5 is greater than 13FFBh but less than or equal to FFFCh then the sum is divided by 5 for a signal that is 14 bits or less. When the sum of the 6 input signals 0 to 5 is greater than FFFCh but less than BFFDh then the sum is divided by 4 for a signal that is 14 bits or less. When the sum of the 6 input signals 0 to 5 is greater BFFDh but less than 7FFEh then the sum is divided by 3 for a signal that is 14 bits or less. Finally, when the sum of the 6 input signals 0 to 5 is greater than 7FFEh but less than or equal to 3FFFh then the sum is divided by 2 for a signal that is 14 bits or less.

Figure 5:
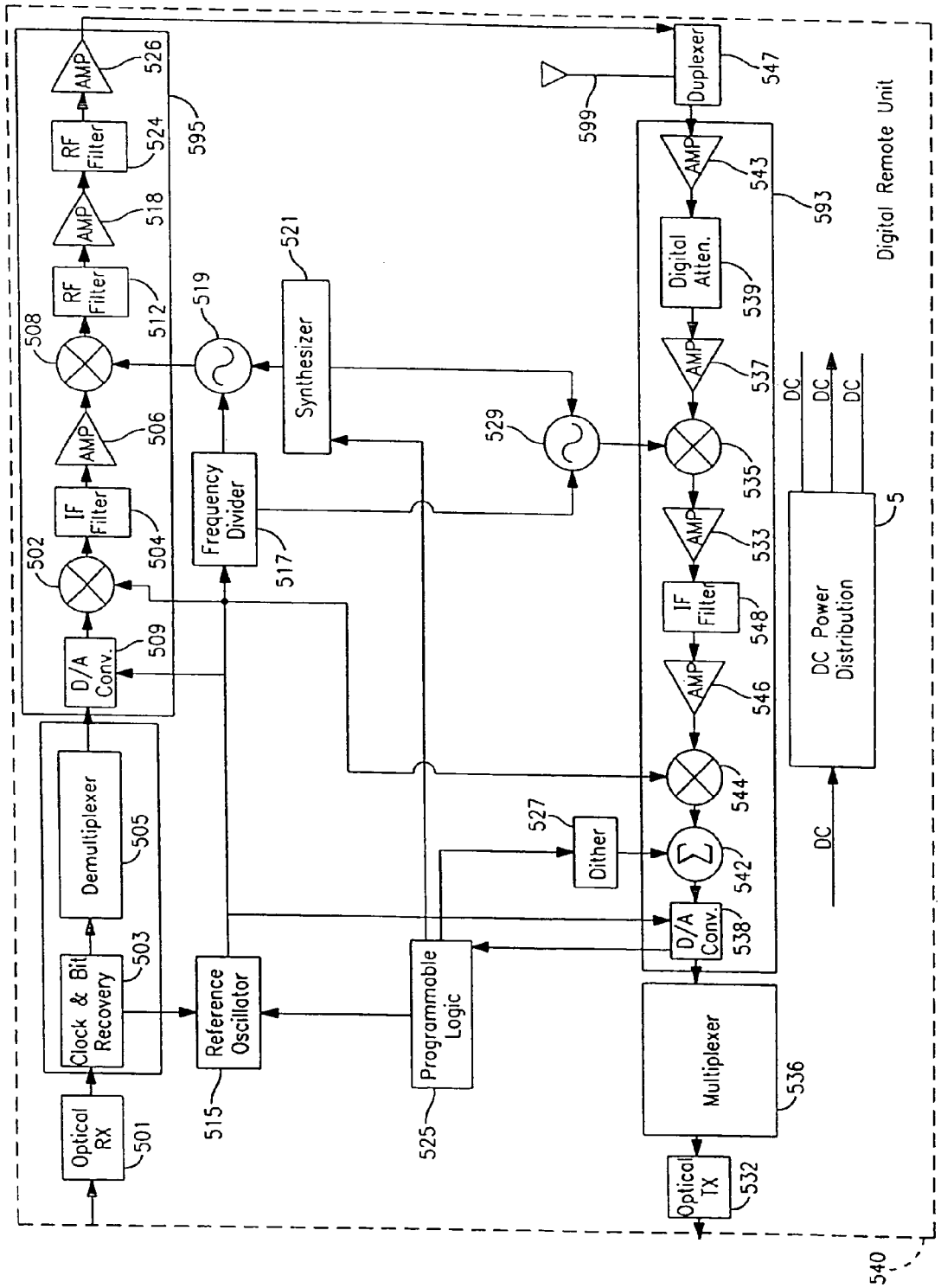
FIG. 5 is a block diagram of one embodiment of a digital remote unit according to the teachings of the present invention.

FIG. 5 is a block diagram of one embodiment of a digital remote unit (DRU) 540 constructed according to the teachings of the present invention. A digital optical receiver 501 receives the optical digital data stream transmitted from a DHU directly or via a DEU. Receiver 501 converts the optical data stream to a corresponding series of electrical pulses. The electrical pulses are applied to clock and bit recovery circuit 503. The series of electrical pulses are then applied to demultiplexer 505. Demultiplexer 505 extracts the digitized traffic signals and converts the signals from serial to parallel. The output parallel signal is then applied to digital to RF converter 595 for conversion to RF and transmission to duplexer 547. RF converter 595 is connected to the main antenna 599 through a duplexer 547. Accordingly, radio frequency signals originating from a wireless interface device are transmitted from main antenna 547.

In one embodiment, digital to RF converter 595 includes a digital-to-analog (D/A) converter 509, which reconstructs the analog RF signal and applies it to IF 504 and amplifier 506. The analog signal is mixed with an output signal of reference oscillator 515 by mixer 502. The output of amplifier 506 is mixed with a signal from local oscillator 519 that locks the RF signal with the return digital signal via reference oscillator 515 that is coupled to local oscillator 519. In one embodiment, the reference oscillator is coupled to frequency divider 517 that in turn is coupled to local oscillators 519 and 529. The local oscillators 519 and 529 are also coupled to synthesizer 521 that is coupled to programmable logic device 525.

RF signals received at main antenna 599 are passed through duplexer 547 to RF to digital converter 593. The RF signals are converted to digital signals and then applied to multiplexer 536 converted from parallel-to-serial and optically transmitted via optical transmitter 532 to a DEU or DHU.

In one embodiment, RF to digital converter 593 includes a first amplifier 543 that receives RF signals from duplexer 547, amplifies the signals and transmits them to digital attenuator 539. In one embodiment, amplifier 543 is a low noise amplifier. Digital attenuator 539 receives the amplified signals and digitally attenuates the signal to control the levels in case of an overload situation. RF to digital converter 593 further includes a second amplifier 537, which receives the attenuated signals, amplifies the signals and applies the amplified signals to mixer 535. Mixer 535 mixes the amplified signals with a signal received from local oscillator 529. The resultant signals are applied to a third amplifier 533 an IF filter 548 and a fourth amplifier 546 in series to down convert to an IF signal. The IF signal is then mixed with a signal from reference oscillator 515 and the mixed signal is summed with a signal from dither circuit 527. The resultant signal is applied to analog-to-digital converter 538 and converted to a digital signal. The output digital signal is then applied to a multiplexer 536. In one embodiment, the multiplexer 536 multiplexes the signal together with a couple of extra bits to do framing and control information. In one embodiment, multiplexer 536, clock and bit recovery circuit and demultiplexer 505 comprise a multiplexer chip set.

Programmable logic circuit 525 programs synthesizer 521 for the reference oscillator and for the up and down conversion of local oscillators 519 and 529. The programmable logic circuit 525 looks for error conditions, for out of lock conditions on the oscillators and reports error modes and looks for overflow condition in the A/D converter 538. If an overflow condition occurs the programmable logic circuit 525 indicates that you are saturating and adds some extra attenuation at digital attenuator 539 in order to reduce the RF signal levels coming in from RF antenna 599 and protect the system from overload.

In one embodiment, DRU 540 includes an internal direct current power distribution system 5. In one embodiment, the distribution system receives 48 VDC and internally distributes 3 outputs of +3.8V, +5.5V and +8V.

Figure 6:
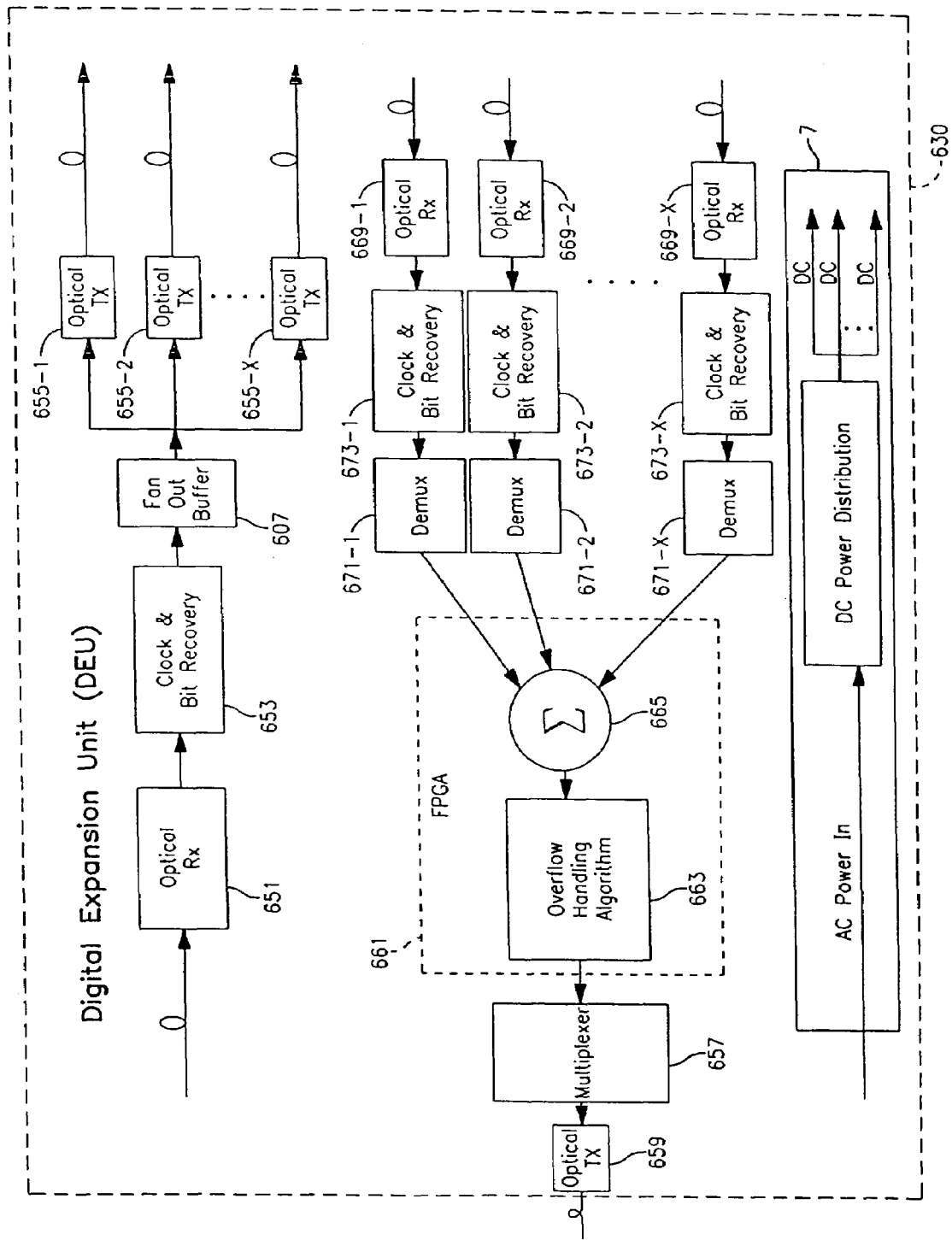
FIG. 6 is a block diagram of one embodiment of a digital expansion unit according to the teachings of the present invention.

FIG. 6 is a block diagram of one embodiment of a digital expansion unit (DEU) 630 constructed according to the teachings of the present invention. DEU 630 is designed to receive optical signals and transmit optical signals. An optical receiver 651 receives digitized RF signals and transmits them to clock and bit recovery circuit 653 that performs clock and bit recovery to lock the local clock and clean up the signal. The signals are then split into X RF digital signals by 1 to X fan out buffer 607. The signals are then transmitted via optical transmitters 655-1 to 655-X to X receiving units such as DEUs or DRUs. The X receiving units may be any combination of DEUs or DRUs. In one embodiment, X is equal to six.

DEU 630 also includes optical receivers 669-1 to 669-X, which receive digitized RF signals directly from DRUs or indirectly via DEUs. In operation the signals are received, applied to clock and bit recovery circuits 673-1 to 673-X respectively to lock the local clock and clean up the signals and then applied to demultiplexers 671-1 to 671-X. Demultiplexers 671-1 to 671-X each extract the digitized traffic and apply the samples to field programmable gate array 661. The signals are summed together digitally and transmitted to multiplexer 657, which multiplexes the signal together with a couple of extra bits to do framing and control information. In addition, the multiplexer 657 converts the signals parallel to serial. The signals are then applied to optical transmitter 659 for further transmission. In one embodiment, the signals are directly transmitted to a DHU or indirectly via one or more additional DEUs.

In one embodiment, the FPGA 661 includes summer 665, which mathematically sums together the digital RF signals received from demultiplexers 671-1 to 671-X. In another embodiment, FPGA 661 includes an overflow algorithm circuit 663 coupled to the output of summer 665. The algorithm circuit 663 allows the summed digital RF signals to saturate and keep the summed signal within a defined number of bits. In one embodiment, the algorithm circuit includes a limiter. In one embodiment, the RF signals are 14-bit signals and when summed and limited by summer 665 and overflow algorithm 663 result in a 14-bit output signal.

In one embodiment, DEU 630 includes an alternating current to digital current power distribution circuit 7 that provides direct current power to each of the DRUs coupled to DEU 630.

Figure 7:
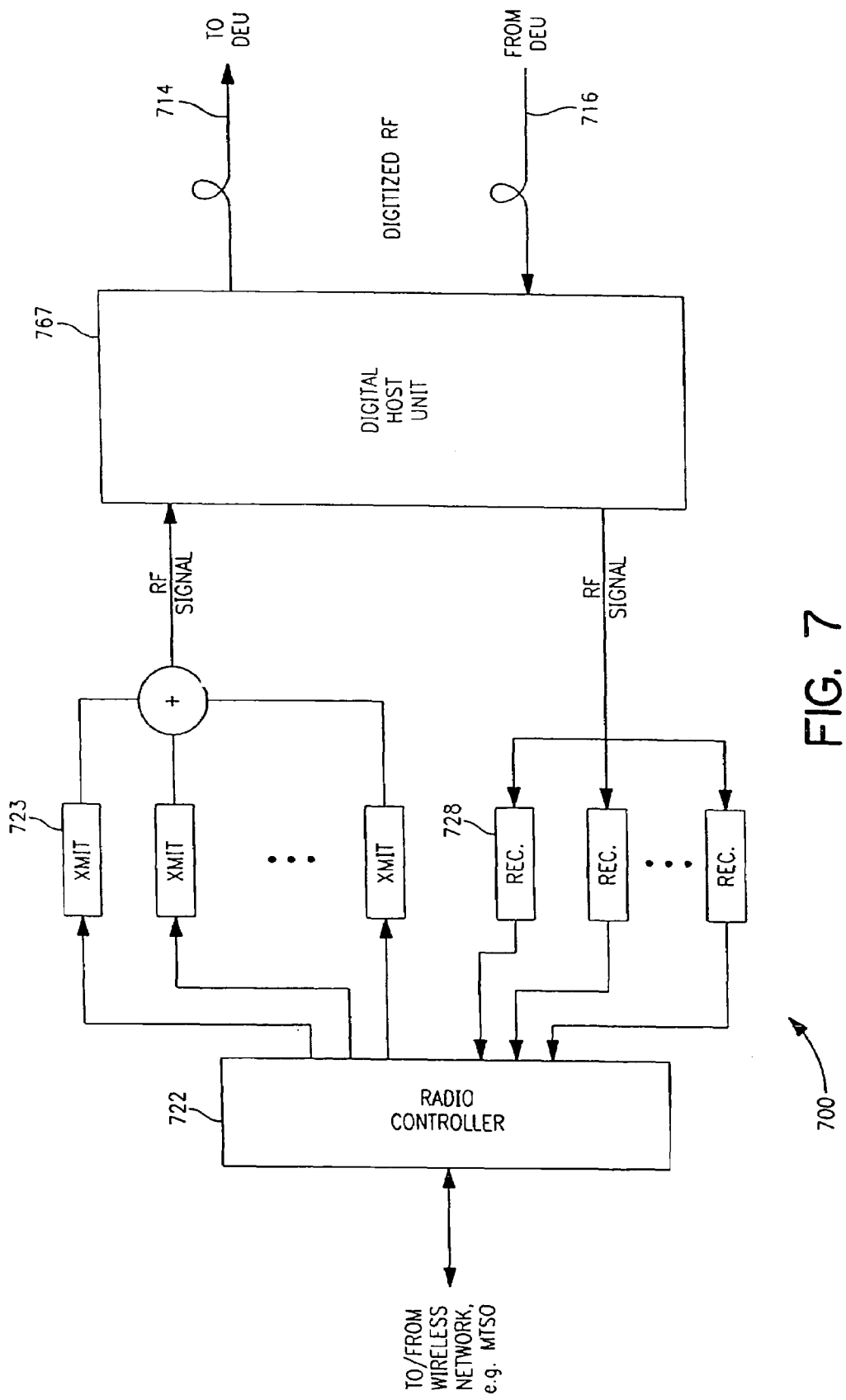
FIG. 7 is a block diagram of one embodiment of a microcell base station according to the teachings of the present invention.

In an alternate embodiment, the digital host unit (DHU) and wireless interface device (WID) are located some distance from the building being served. The DHU in the building is replaced by a DEU, and the link between that DEU and the remotely located DHU is via single mode fiber. FIG. 7 is a block diagram of this embodiment. A microcell base station shown generally at 700 includes conventional transmitters and receivers 723 and 728, respectively, and conventional radio controller or interface circuitry 722. In the forward path, a DHU 767 receives the combined RF signal from transmitters 723, digitizes the combined signal and transmits it in digital format over single mode fiber to a DEU. In the reverse path, DHU 767 receives digitized RF signal from a DEU, reconstructs the corresponding analog RF signal, and applies it to receivers 728.

In another alternate embodiment, the wireless interface device (WID) is a software defined base station, and the interface between the DHU and WID takes place digitally, eliminating the need for the RF to digital conversion circuitry in the DHU.

CONCLUSION

A digital radio frequency transport system has been described. The transport system includes a digital host unit and at least two digital remote units coupled to the digital host unit. The digital host unit includes shared circuitry that performs bi-directional simultaneous digital radio frequency distribution between the digital host unit and the at least two digital remote units.

In addition, a digital radio frequency transport system has been described. The transport system includes a digital host unit and at least one digital expansion unit coupled to the digital host unit. The transport system further includes at least two digital remote units, each coupled to one of the digital host unit and the digital expansion unit. The digital host unit includes shared circuitry that performs bi-directional simultaneous digital radio frequency distribution between the digital host unit and that at least two digital remote units.

Further, a method of performing point-to-multipoint radio frequency transport has been described. The method includes receiving analog radio frequency signals at a digital host unit and converting the analog radio frequency signals to digitized radio frequency signals. The method also includes splitting the digitized radio frequency signals into a plurality of a digital radio frequency signals and optically transmitting the digital radio frequency signals to a plurality of digital remote units. The method further includes receiving the digital radio frequency signals at a plurality of digital remote units, converting the digital radio frequency signals to analog radio frequency signals and transmitting the signals via a main radio frequency antenna at each of the plurality of digital remote units.

Although specific embodiments have been illustrated and described herein, it will be appreciated by those of ordinary skill in the art that any arrangement which is calculated to achieve the same purpose may be substituted for the specific embodiments shown. For example, a digital remote unit is not limited to the receipt and summing and splitting and transmitting of digitized radio frequency signals. In other embodiments, the digital host unit is capable of receiving and summing analog radio frequency signals in addition to or instead of digitized radio frequency signals. As well, the digital host unit is capable of splitting and transmitting analog radio frequency signals in addition to or instead of digitized radio frequency signals. This application is intended to cover any adaptations or variations of the present invention. Therefore, it is intended that this invention be limited only by the claims and the equivalents thereof.

What is claimed is:

1. A digital radio frequency transport system, comprising:
   a digital host unit; and
   at least two digital remote units coupled to the digital host unit, wherein the digital host unit includes shared circuitry that performs bi-directional simultaneous digital radio frequency distribution of digitized radio frequency signals between the digital host unit and the at least two digital remote units;
   wherein the digital host unit digitally sums the digitized radio frequency signals received at the digital host unit.

2. The system of claim 1, further comprising a wireless interface device coupled to the digital host unit.

3. The system of claim 2, wherein the wireless interface device comprises a base station that couples directly to the digital host unit via coaxial cables.

4. The system of claim 2, wherein the wireless interface device comprises a base station that wirelessly connects to the digital host unit via a bi-directional amplifier.

5. The system of claim 1, wherein the at least two digital remote units each include a main radio frequency antenna which transmits and receives radio frequency signals.

6. The system of claim 1, wherein the digital host unit includes a radio frequency to digital converter that converts a main radio frequency signal to at least a portion of the digitized radio frequency signals.

7. The system of claim 6, wherein the digital host unit further includes a multiplexer which splits the digitized radio frequency signals into at least two digital signals for optical transmission to the at least two digital remote units.

8. The system of claim 7, wherein the digital host unit further comprises an alarm/control interface circuit coupled to the multiplexer.

9. The system of claim 1, wherein the digital host unit includes local oscillators coupled to a reference oscillator for synchronization of the radio frequency signal in the forward direction and in the reverse direction.

10. The system of claim 1, wherein the digital host unit is coupled to each of the at least two digital remote units by a multimode fiber pair.

11. The system of claim 1, further comprising a digital expansion unit coupled to the digital host unit, wherein the digital expansion unit contains circuitry that performs bi-directional simultaneous digital radio frequency distribution between the digital host unit and the digital remote unit.

12. The system of claim 11, wherein the digital expansion unit is coupled to the digital host unit by a multimode fiber pair.

13. The system of claim 11, wherein the digital expansion unit is coupled to the digital host unit by single mode fiber.

14. A digital radio frequency transport system, comprising:
   a digital host unit;
   at least one digital expansion unit coupled to the digital host unit; and
   at least two digital remote units, each coupled to one of the digital host unit and the digital expansion unit, wherein the digital host unit includes shared circuitry that performs bi-directional simultaneous digital radio frequency distribution of digitized radio frequency signals between the digital host unit and the at least two digital remote units;
   wherein the digital host unit digitally sums the digitized radio frequency signals received at the digital host unit.

15. The system of claim 14, further comprising a wireless interface device coupled to the digital host unit.

16. The system of claim 15, wherein the wireless interface device comprises a base station that couples directly to the digital host unit via coaxial cables.

17. The system of claim 15, wherein the wireless interface device comprises a base station that wirelessly connects to the digital host unit via a bi-directional amplifier.

18. The system of claim 14, wherein at least one of the at least two digital remote units is coupled to the digital host unit.

19. The system of claim 14, wherein at least one of the at least two digital remote units is coupled to the at least one digital expansion unit.

20. The system of claim 14, wherein the at least one digital expansion units are each coupled to the digital host unit via a multimode fiber pair.

21. The system of claim 14, wherein the at least one digital expansion unit is coupled to the digital host unit via a single mode fiber.

22. The system of claim 14, wherein the digital host unit includes a radio frequency to digital converter that converts a main radio frequency signal to at least a portion of the digitized radio frequency signals.

23. The system of claim 22, wherein the digital host unit further includes a multiplexer which splits the digitized radio frequency signals into at least two digital signals for optical transmission to the at least two digital remote units.

24. The system of claim 14, wherein the digital host unit includes local oscillators coupled to a reference oscillator for synchronization of the radio frequency signal in the forward direction and in the reverse direction.

25. A method of performing multipoint-to-point digital radio frequency transport, the method comprising:
   receiving analog radio frequency signals at multiple digital remote units;
   converting the analog radio frequency signals to digital radio frequency signals at each of the digital remote units;
   optically transmitting the digital radio frequency signals from each of the digital remote units to a digital host unit;
   receiving the multiple digital radio frequency signals at the digital host unit;
   digitally summing the multiple digital radio frequency signals together; and
   converting the summed multiple digital radio frequency signals back to analog radio frequency signals and transmitting the signals to a wireless interface device for further transmission to a switched telephone network.

26. The method of claim 25, wherein converting the analog radio frequency signals to digital radio frequency signals comprises amplifying the analog radio frequency signals.

27. The method of claim 25, wherein converting the analog radio frequency signals to digital radio frequency signals comprises synchronizing a reverse path local oscillator to a master clock so as to reduce end-to-end frequency translation.

28. A method of performing point-to-multipoint digital radio frequency transport, the method comprising:
   receiving radio frequency signals at a digital host unit;
   converting, using a shared analog-to-digital converter, the radio frequency signals to a digitized radio frequency spectrum;
   optically transmitting the digitized radio frequency spectrum output by the shared analog-to-digital converter to a plurality of digital remote units;
   receiving the digitized radio frequency spectrum at the plurality of digital remote units;
   converting the digitized radio frequency spectrum to analog radio frequency signals; and
   transmitting the analog radio frequency signals via a main radio frequency antenna at each of the plurality of digital remote units.

29. The method of claim 28, wherein converting the radio frequency signals to a digitized radio frequency spectrum comprises amplifying the radio frequency signals.

30. The method of claim 28, wherein converting the radio frequency signals to a digitized radio frequency spectrum digital radio frequency signals comprises synchronizing a forward path local oscillator to a reference oscillator so as to reduce end-to-end frequency translation.

31. The method of claim 28, wherein converting the digitized radio frequency spectrum to analog radio frequency signals comprises amplifying the analog radio frequency signals.

32. The method of claim 28, wherein converting the digitized radio frequency spectrum to analog radio frequency signals comprises synchronizing a forward path local oscillator to a reference oscillator so as to reduce end-to-end frequency translation.

33. A method of performing point-to-multipoint digital radio frequency transport, the method comprising:
   receiving radio frequency signals at a digital host unit;
   converting the radio frequency signals to a digitized radio frequency spectrum;
   optically transmitting a first digitized radio frequency spectrum to a first plurality of digital remote units and at least one digital expansion unit;
   receiving the digitized radio frequency spectrum at the first plurality of digital remote units;
   converting the digitized radio frequency spectrum to analog radio frequency signals at each of the first plurality of digital remote units;
   receiving the digital radio frequency signals at the at least one digital expansion unit;
   optically transmitting a second digitized radio frequency spectrum to a second plurality of digital remote units;
   receiving the second digitized radio frequency spectrum at the second plurality of digital remote units;
   converting the second digitized radio frequency spectrum to analog radio frequency signals at each of the second plurality of digital remote units; and
   transmitting the analog radio frequency signals via a main radio frequency antenna at each of the first and second plurality of digital remote units.

34. A digital radio frequency transport system, comprising:
   a digital host unit; and
   at least two digital remote units coupled to the digital host unit, wherein the at least two digital remote units each include:
      a main radio frequency antenna;
      a duplexer coupled to the main radio frequency antenna which receives
         radio frequency signals in the reverse path and transmits radio frequency signals in the forward path;
      a radio frequency to digital converter coupled to the duplexer in the reverse path;
      a digital to radio frequency converter coupled to the duplexer in the forward path;
      a multiplexer chip set coupled to the radio frequency to digital converter in the reverse path and the digital to radio frequency converter in the forward path;
      an optical transmitter coupled to an output of the multiplexer chip set; and
      an optical receiver coupled to an input of the multiplexer chip set;
   wherein the digital host unit includes shared circuitry that performs bi-directional simultaneous digital radio frequency distribution of digitized radio frequency signals between the digital host unit and the at least two digital remote units;
   wherein the digital host unit digitally sums the digitized radio frequency signals received at the digital host unit.

35. The system of claim 34, wherein the digital host unit includes an alarm/control interface circuit.

36. A digital radio frequency transport system, comprising:
a digital host unit, wherein the digital host unit includes a channel summer to digitally sum digitized RF signals received at the digital host;
at least one digital expansion unit coupled to the digital host unit; and
at least two digital remote units coupled to the digital host unit, wherein the digital host unit includes shared circuitry that performs bi-directional simultaneous digital radio frequency distribution between the digital host unit and the at least two digital remote units.

37. A first unit comprising:
an interface to communicatively couple the first unit to a plurality of second units using at least one communication medium, wherein the plurality of second units are located remotely from the first unit;
an analog-to-digital unit to digitize a downstream analog radio frequency signal produced for radiation from an antenna in order to produce downstream digital RF samples;
a digital-to-analog unit to convert a stream of summed upstream digital RF samples to a replicated upstream analog radio frequency signal; and
a digital summer to produce each of the summed upstream digital RF samples by digitally summing respective upstream digital RF samples received from the plurality of second units;
wherein the upstream digital RF samples received from the plurality of second units have an associated resolution;
wherein the digital summer has a resolution that is greater than the resolution associated with the digitized radio frequency signals being digitally summed; and
wherein the first unit communicates at least a portion of the downstream digital RF samples to the plurality of second units.

38. The first unit of claim 37, wherein the communication medium comprises at least one of single mode optical fiber, multi-mode optical fiber, and coaxial cable.

39. The first unit of claim 37, wherein the interface is operable to communicatively couple the first unit to at least one second unit using a pair of optical fibers, wherein a first optical fiber included in the pair is used to communicate the at least a portion of the downstream digital RF samples to the at least one second unit and a second optical fiber included in the pair is used to receive respective upstream digital RF samples from the at least one second unit.

40. The first unit of claim 37, wherein the first unit comprises at least one of a digital host unit and a digital expansion unit.

41. The first unit of claim 37, wherein each of the plurality of second units comprises at least one of a remote antenna unit and a remote expansion unit.

42. The first unit of claim 37, further comprising:
a respective demultiplexer for each of the plurality of second units, wherein each of the demultiplexers extracts the first digital samples from a framed serial bit stream received from a respective one of the plurality of second units.

43. The first unit of claim 37, further comprising:
a multiplexer to produce a framed serial bit stream from the second digital samples, wherein the framed serial bit stream is communicated to the plurality of second units.

44. The first unit of claim 37, further comprising a clock recovery circuit.

45. A system for bi-directional radio frequency signal distribution system comprising:
a host unit; and
a plurality of other units communicatively coupled to the host unit using at least one communication medium, wherein the plurality of other units are located remotely from the host unit;
wherein the host unit comprises:
an interface to communicatively couple the host unit to the plurality of other units using the at least one communication medium;
an analog-to-digital unit configured to digitize an original downstream analog radio frequency signal produced for radiation from a respective antenna in order to produce downstream digital RF samples;
a digital-to-analog unit configured to convert a stream of summed upstream digital RF samples to a replicated upstream analog radio frequency signal; and
a digital summer to produce each of the summed upstream digital RF samples by digitally summing respective upstream digital RF samples received from the plurality of other units;
wherein the host unit communicates at least a portion of the downstream digital RF samples to the plurality of other units;
wherein each of the other units digitizes an original upstream analog radio frequency signal produced for radiation from a respective antenna in order to produce the upstream digital RF samples, at least a portion of which are communicated to the host unit, wherein the upstream digital RF samples have an associated resolution; and
wherein each of the other units convert the downstream digital RF samples received thereat to a replicated downstream analog radio frequency signal; and
wherein the digital summer has a resolution that is greater than the resolution associated with the upstream digital RF samples being summed.

46. The system of claim 45, wherein the host unit comprises at least one of a digital host unit and a digital expansion unit.

47. The system of claim 45, wherein each of the plurality of other units comprises at least one of a remote antenna unit and a remote expansion unit.

48. The system of claim 45, further comprising:
a respective demultiplexer for each of the plurality of other units, wherein each of the demultiplexers extracts the first digital samples from a framed serial bit stream received from a respective one of the plurality of other units.

49. The system of claim 45, further comprising:
a multiplexer to produce a framed serial bit stream from the other digital samples, wherein the framed serial bit stream is communicated to the plurality of other units.

50. The system of claim 45, further comprising a clock recovery circuit.

51. A method comprising, at a first unit that is communicatively coupled to a plurality of second units, performing the following:
digitizing a downstream analog radio frequency signal produced for radiation from an antenna in order to produce downstream digital RF samples;
communicating at least a portion of the downstream digital RF samples to the plurality of second units, wherein the plurality of second units are located remotely from the first unit;
receiving from the plurality of second units respective upstream digital RF samples, wherein the upstream digital RF samples have an associated resolution;

digitally summing respective upstream digital RF samples received from the plurality of second units in order to produce each of a stream of summed upstream digital RF samples, wherein the respective upstream digital RF samples received from the plurality of second units are digitally summed with a resolution greater than the resolution of the upstream digital RF samples being summed;

converting the stream of summed upstream digital RF samples to a replicated upstream analog radio frequency signal.

52. A first unit comprising:

an interface configured to communicatively couple the first unit to a plurality of second units using at least one communication medium, wherein the first unit is configured to use the interface to communicate to the plurality of second units downstream digital RF samples produced from a downstream analog radio frequency signal produced for radiation from an antenna and wherein the plurality of second units are located remotely from the first unit;

a power distribution interface configured to provide power to at least one of the plurality of second units; and a digital-to-analog unit configured to convert a stream of summed upstream digital RF samples to a replicated upstream analog radio frequency signal; and wherein each of the summed upstream digital RF samples is produced by digitally summing respective upstream digital RF samples received from the plurality of second units;

wherein the upstream digital RF samples received from the plurality of second units have an associated resolution; and wherein the upstream digital RF samples are digitally summed with a resolution that is greater than the resolution associated with the upstream digital RF samples being digitally summed.

53. The first unit of claim 52, further comprising an analog-to-digital unit to digitize the original downstream analog radio frequency signal in order to produce the downstream digital RF samples.

54. The first unit of claim 52, wherein the communication medium comprises at least one of single mode optical fiber, multi-mode optical fiber, and coaxial cable.

55. The first unit of claim 52, wherein the interface is operable to communicatively couple the first unit to at least one second unit using a pair of optical fibers, wherein a first optical fiber included in the pair is used to communicate the at least a portion of the downstream digital RF samples to the at least one second unit and a second optical fiber included in the pair is used to receive respective upstream digital RF samples from the at least one second unit.

56. The first unit of claim 52, wherein the first unit comprises at least one of a digital host unit and a digital expansion unit.

57. The first unit of claim 52, wherein each of the plurality of second units comprises at least one of a remote antenna unit and a remote expansion unit.

58. A system for bi-directional radio frequency signal distribution comprising:

a host unit; and a plurality of other units communicatively coupled to the host unit using at least one communication medium, wherein the plurality of other units are located remotely from the host unit;

wherein the host unit comprises:

an interface configured to communicatively couple the host unit to the plurality of other units using the at least one communication medium, wherein the host unit is configured to use the interface to communicate to the plurality of other units downstream digital RF samples produced from an original downstream analog radio frequency signal produced for radiation from a respective antenna;

a power distribution interface to provide power to at least one of the plurality of other units;

a digital-to-analog unit configured to convert a stream of summed upstream digital RF samples to a replicated upstream analog radio frequency signal; and a digital summer to produce each of the summed upstream digital RF samples by digitally summing respective upstream digital RF samples received from the plurality of other units;

wherein each of the other units digitizes an original upstream analog radio frequency signal produced for radiation from a respective antenna in order to produce the upstream digital RF samples, at least a portion of which are communicated to the host unit, wherein the upstream digital RF samples have an associated resolution;

wherein the digital summer has a resolution that is greater than the resolution of the upstream digital RF samples being summed;

wherein each of the other units convert the downstream digital RF samples received thereat to a replicated downstream analog radio frequency signal; and wherein at least one of the other units is at least partially powered by power received from the host unit.

59. The system of claim 58, wherein the host unit further comprises an analog-to-digital unit to digitize the original downstream analog radio frequency signal in order to produce the downstream digital RF samples.

60. The system of claim 58, wherein the communication medium comprises at least one of single mode optical fiber, multi-mode optical fiber, and coaxial cable.

61. The system of claim 58, wherein the interface of the host unit is operable to communicatively couple the host unit to at least one other unit using a pair of optical fibers, wherein a first optical fiber included in the pair is used to communicate the at least a portion of the downstream digital RF samples to the at least one other unit and a second optical fiber included in the pair is used to receive respective upstream digital RF samples from the at least one other unit.

62. The system of claim 58, wherein the host unit comprises at least one of a digital host unit and a digital expansion unit.

63. The system of claim 58, wherein each of the plurality of other units comprises at least one of a remote antenna unit and a remote expansion unit.

64. A method comprising, at a first unit that is communicatively coupled to a plurality of second units, performing the following:

digitizing an original downstream analog radio frequency signal produced for radiation from an antenna in order to produce downstream digital RF samples;

communicating at least a portion of the downstream digital RF samples to the plurality of second units, wherein the plurality of second units are located remotely from the first unit;

receiving from the plurality of second units respective upstream digital RF samples, the upstream digital RF samples having an associated resolution;

digitally summing respective upstream digital RF samples received from the plurality of second units in order to produce each of a stream of summed upstream digital RF samples, wherein the respective upstream digital RF samples received from the plurality of second units are digitally summed with a resolution greater than the resolution of the upstream digital RF samples being summed;

converting the stream of summed upstream digital RF samples to a replicated upstream analog radio frequency signal; and distributing power to at least one of the second units.

65. A first unit comprising:

an interface to communicatively couple the first unit to a plurality of second units using at least one communication medium, wherein the first unit uses the interface to communicate to the plurality of second units downstream digital RF samples produced from an original downstream analog radio frequency signal; and a digital-to-analog unit to convert a stream of summed upstream digital RF samples to a replicated upstream analog radio frequency; and wherein each of the summed upstream digital RF samples is produced by digitally summing respective upstream digital RF samples received from the plurality of second units;

wherein the digital-to-analog unit comprises a digital-to-analog converter, a first mixer, and a second mixer;

wherein the stream of summed upstream digital RF samples is converted to an analog signal by the digital-to-analog converter;

wherein a signal derived from the analog signal is mixed with a first reference signal by the first mixer;

wherein a signal derived from a signal output by the first mixer is mixed with a second reference signal by the second mixer; and wherein the second reference signal is generated by frequency dividing the first reference signal.

66. The first unit of claim 65, further comprising an analog-to-digital unit to digitize the original downstream analog radio frequency signal in order to produce the downstream digital RF samples, wherein the analog-to-digital unit comprises a third mixer, a fourth mixer, and an analog-to-digital converter;

wherein a signal derived from the original downstream analog radio frequency signal is mixed with a third reference signal by the third mixer;

wherein a signal derived from a signal output by the third mixer is mixed with the first reference signal by the fourth mixer; and wherein a signal derived from a signal output by the fourth mixer is digitized to produce the downstream digital RF samples;

wherein the third reference signal is generated by frequency dividing the first reference signal.

67. The first unit of claim 66, wherein the signal derived from the signal output by the fourth mixer that is digitized to produce the downstream digital RF samples is produced by adding dither to the signal output by fourth mixer.

68. The first unit of claim 65, wherein the first unit comprises at least one of a digital host unit and a digital expansion unit.

69. The first unit of claim 65, wherein each of the plurality of second units comprises at least one of a remote antenna unit and a remote expansion unit.

70. A system for bi-directional radio frequency signal distribution comprising:

a host unit; and a plurality of other units communicatively coupled to the host unit using at least one communication medium;

wherein the host unit comprises:

an interface to communicatively couple the host unit to the plurality of other units using the at least one communication medium, wherein the host unit uses the interface to communicate to the plurality of other units downstream digital RF samples produced from an original downstream analog radio frequency signal; and a digital-to-analog unit to convert a stream of summed upstream digital RF samples to a replicated upstream analog radio frequency; and wherein each of the summed upstream digital RF samples is produced by digitally summing respective upstream digital RF samples received from the plurality of other units;

wherein the digital-to-analog unit comprises a digital-to-analog converter, a first mixer, and a second mixer;

wherein the stream of summed upstream digital RF samples is converted to an analog signal by the digital-to-analog converter;

wherein a signal derived from the analog signal is mixed with a first reference signal by the first mixer;

wherein a signal derived from a signal output by the first mixer is mixed with a second reference signal by the second mixer;

wherein the second reference signal is generated by frequency dividing the first reference signal;

wherein each of the other units digitizes an original upstream analog radio frequency in order to produce the upstream digital RF samples, at least a portion of which are communicated to the host unit;

wherein each of the other units convert the downstream digital RF samples received thereat to a replicated downstream analog radio frequency; and wherein at least one of the other units is at least partially powered by power received from the host unit.

71. The system of claim 70, wherein the host unit further comprises an analog-to-digital unit to digitize the original downstream analog radio frequency signal in order to produce the downstream digital RF samples, wherein the analog-to-digital unit comprises a third mixer, a fourth mixer, and an analog-to-digital converter;

wherein a signal derived from the original downstream analog radio frequency signal is mixed with a third reference signal by the third mixer;

wherein a signal derived from a signal output by the third mixer is mixed with the first reference signal by the fourth mixer; and wherein a signal derived from a signal output by the fourth mixer is digitized to produce the downstream digital RF samples;

wherein the third reference signal is generated by frequency dividing the first reference signal.

72. The system of claim 71, wherein the signal derived from the signal output by the fourth mixer that is digitized to produce the downstream digital RF samples is produced by adding dither to the signal output by fourth mixer.

73. The system of claim 70, wherein the host unit further comprises an analog-to-digital unit to digitize the original downstream analog radio frequency signal in order to produce the downstream digital RF samples.

74. A method comprising, at a first unit that is communicatively coupled to a plurality of second units, performing the following:
- digitizing an original downstream analog radio frequency signal in order to produce downstream digital RF samples;
- communicating at least a portion of the downstream digital RF samples to the plurality of second units;
- receiving from the plurality of second units respective upstream digital RF samples;
- digitally summing respective upstream digital RF samples received from the plurality of second units in order to produce each of a stream of summed upstream digital RF samples;
- converting the stream of summed upstream digital RF samples to an analog signal;
- mixing a signal derived from the analog signal is with a first reference signal to produce a first mixed signal;
- mixing a signal derived from a first mixed signal with a second reference signal; and
- generating the second reference signal by frequency dividing the first reference signal.

75. A first unit comprising:
- an interface to communicatively couple the first unit to the plurality of second units using at least one communication medium;
- an analog-to-digital unit to digitize an original downstream analog radio frequency signal in order to produce downstream digital RF samples;
- a digital-to-analog unit to convert a stream of summed upstream digital RF samples to a replicated upstream analog radio frequency; and
- wherein the first unit produces each of the summed upstream digital RF samples by digitally summing respective upstream digital RF samples received from the plurality of second units; and
- wherein the first unit communicates at least a portion of the downstream digital RF samples to the plurality of second units;

wherein sample rates used by the host unit and the other units are locked together.

76. The first unit of claim 75, wherein the first unit comprises at least one of a digital host unit and a digital expansion unit.

77. The first unit of claim 75, wherein each of the plurality of second units comprises at least one of a remote antenna unit and a remote expansion unit.

78. A system for bi-directional radio frequency signal distribution system comprising:
- a host unit; and
- a plurality of other units communicatively coupled to the host unit using at least one communication medium;

wherein the host unit comprises:
- an interface to communicatively couple the host unit to the plurality of other units using the at least one communication medium;
- an analog-to-digital unit to digitize an original downstream analog radio frequency signal in order to produce downstream digital RF samples; and
- a digital-to-analog unit to convert summed upstream digital RF samples to a replicated upstream analog radio frequency; and wherein the host unit produces each of the summed upstream digital RF samples by digitally summing respective upstream digital RF samples received from the plurality of other units; and wherein the host unit communicates at least a portion of the downstream digital RF samples to the plurality of other units;

wherein each of the other units digitizes an original upstream analog radio frequency in order to produce the upstream digital RF samples, at least a portion of which are communicated to the host unit;

wherein each of the other units convert the downstream digital RF samples received thereat to a replicated downstream analog radio frequency; and wherein sample rates used by the host unit and the other units are locked together.

79. The system of claim 78, wherein the host unit comprises at least one of a digital host unit and a digital expansion unit.

80. The system of claim 78, wherein each of the plurality of other units comprises at least one of a remote antenna unit and a remote expansion unit.

81. A first unit comprising:
- means for communicatively coupling the first unit to a plurality of second units;
- means for digitizing an original downstream analog radio frequency signal in order to produce downstream digital RF samples;
- means for communicating at least a portion of the downstream digital RF samples to the plurality of second units;
- means for receiving from the plurality of second units respective upstream digital RF samples, the upstream digital RF samples having an associated resolution;
- means for digitally summing respective upstream digital RF samples received from the plurality of second units in order to produce each of a stream of summed upstream digital RF samples, wherein the means for digitally summing has a resolution that is greater than the resolution of the upstream digital RF samples being summed; and
- means for converting the stream of summed upstream digital RF samples to a replicated upstream analog radio frequency.

* * * * *

UNITED STATES PATENT AND TRADEMARK OFFICE
CERTIFICATE OF CORRECTION

PATENT NO. : 7,639,982 B2 Page 1 of 1
APPLICATION NO. : 10/740944
DATED : December 29, 2009
INVENTOR(S) : Philip M. Wala It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 888 days.

Signed and Sealed this

Ninth Day of November, 2010

David J. Kappos
*Director of the United States Patent and Trademark Office*